United States Patent [19]

Jones

[11] Patent Number: 4,516,008

[45] Date of Patent: May 7, 1985

[54] SYSTEM FOR CALCULATING THE ROOT MEAN SQUARE (RMS) CURRENT IN A RESISTANCE WELDING SYSTEM

[75] Inventor: Gary A. Jones, Chatsworth, Calif.

[73] Assignee: Pertron Controls Corporation, Canoga Park, Calif.

[21] Appl. No.: 475,172

[22] Filed: Mar. 14, 1983

[51] Int. Cl.³ .............................................. B23K 11/24
[52] U.S. Cl. .................................... 219/109; 219/110; 324/132
[58] Field of Search ............ 219/108, 109, 110, 117.1, 219/114; 324/83 R, 83 D, 132

[56] References Cited

U.S. PATENT DOCUMENTS

| | | | |
|---|---|---|---|
| 4,076,974 | 2/1978 | Gee | 219/114 |
| 4,245,183 | 1/1981 | Glennon | 324/132 |
| 4,301,351 | 11/1981 | Mathews | 219/110 |
| 4,346,346 | 8/1982 | Silberberg | 324/132 |
| 4,456,809 | 6/1984 | Jones et al. | 219/108 |

Primary Examiner—Clifford C. Shaw
Attorney, Agent, or Firm—Keith D. Beecher

[57] ABSTRACT

A system is provided for use in a microprocessor controlled controller for a resistance welding machine for calculating the RMS value of the welding current so as to provide a closed loop control of the RMS current in order to eliminate the effect of variations in load and line voltage on the welding current and to provide a constant welding tip temperature in the presence of such variations.

5 Claims, 7 Drawing Figures

SYSTEM FOR CALCULATING THE ROOT MEAN SQUARE (RMS) CURRENT IN A RESISTANCE WELDING SYSTEM

BACKGROUND OF THE INVENTION

Controllers for resistance type welding machines are described, for example, in copending application Ser. No. 361,820 filed Mar. 25, 1982 in the name of the present inventor, now U.S. Pat. No. 4,456,809 and in U.S. Pat. No. 4,301,351 which issued in the name of Mathews, both of which are assigned to the present assignee. Both these controllers include circuits for compensating for the effect of line voltage variations on tip temperatures, this being achieved by digitizing the RMS value of the input voltage and by computing the proper firing time during each half-cycle of input voltage and by utilizing the results to maintain constant power to the welding tips in the presence of line voltage fluctuations.

The circuit and system of the present invention controls the effective RMS primary or secondary current, rather than input voltage, to eliminate the effects of load changes, as well as line voltage fluctuations, and thereby maintain constant tip temperatures in the presence of both line voltage fluctuations and load changes.

DETAILED DESCRIPTION OF THE ILLUSTRATED EMBODIMENT

The root-mean-square current is the effective value of the current in an alternating current circuit. The defining equation for root-mean-square current is:

$$I = \sqrt{\frac{1}{T} \int_0^T i^2 dt}$$

Where:
I is the RMS current
T is the interval of integration
i is the instantaneous current as a function of time.

Figure 1:
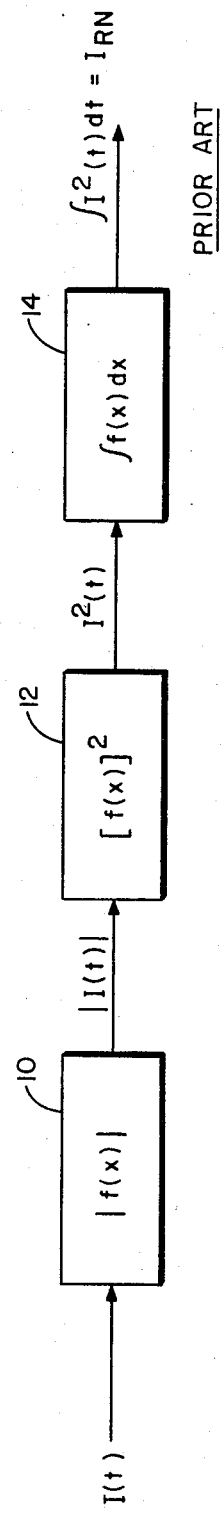
FIG. 1 is a block diagram of a typical prior art system for calculating RMS current in a resistance welding controller.

The usual method for determining RMS current in the prior art resistance welding systems is shown by the block diagram of FIG. 1. In the prior art system, the primary circuit current I(t) is full-wave rectified in block 10 to obtain its absolute value $|I(t)|$, and then, as shown in block 12, the absolute value is squared to obtain $I^2(t)$. The latter value is then integrated in block 14 to obtain the RMS current $I_{RN}$ which equals $\int I^2(t)dt$. However, the primary circuit currents in the typical resistance welding system range from 1–1000 amperes, and when such currents are squared, a dynamic range of 1,000,000–1 is encountered. This high dynamic range creates serious problems and difficulties in designing appropriate implementing circuitry.

Figure 2:
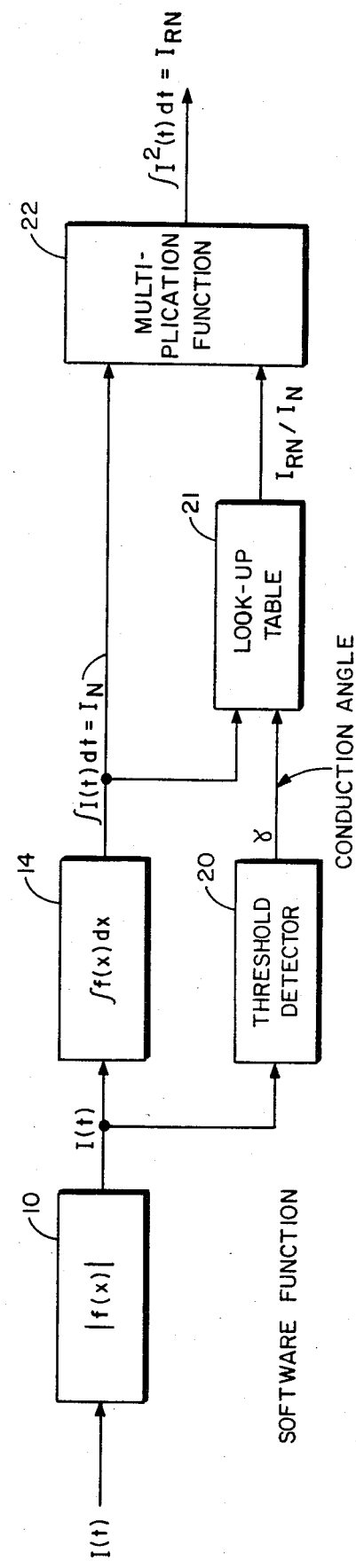
FIG. 2 is a block diagram of a system representative of one embodiment of the invention for calculating the RMS current in a resistance welding controller.

The system of the present invention, as shown in the block diagram of FIG. 2, eliminates the squaring function with its attendant and inherent excessive dynamic range problems. In the system of the invention, the primary circuit current I(t), for example, is full-wave rectified in block 10 to obtain its absolute value $|I(t)|$, as before. This absolute value is integrated, without squaring, in block 14 to obtain the area under the current waveform $I_N = \int I(t)dt$. The RMS value $I_{RN}$ of the current waveform is then detected as a software function of the microprocessor of the controller from the area under the current waveform ($I_N$) and the conduction angle $\gamma$ is obtained from a threshold detector 20 which determines any current flow in either half-cycle of primary current.

The terms $I_N$ and $\gamma$ are processed in the microprocessor to provide $I_{RN}/I_N$ and the microprocessor also multiplies the outputs of blocks 14 and 21, as represented by functional block 22, to provide the desired RMS current $I_{RN}$.

The limitations on the system of FIG. 2 are that the RMS current $I_{RN}$ is calculated only on the presence of non-capacitive inductive/resistance loads, such as are encountered in resistance welding; the system must be driven by an appropriate device such as a thyristor which remains conductive until i goes to zero; and the voltage input must be a sine wave.

Figure 3:
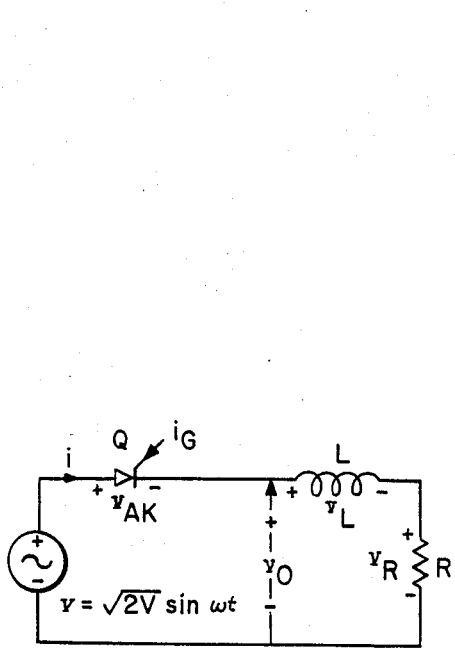
FIG. 3 is an equivalent circuit of a resistance welding system, showing a controlled half-wave thyristor rectifier circuit.
Figure 4:
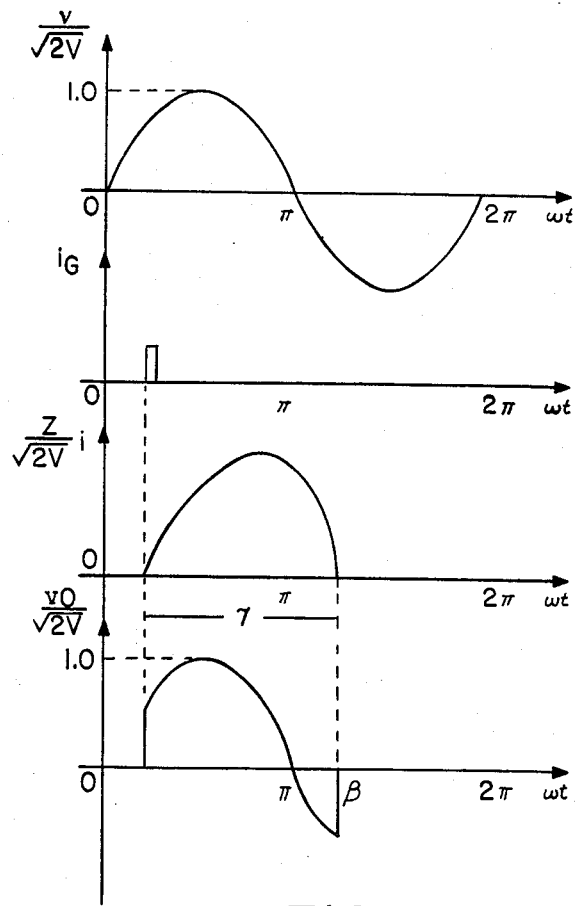
FIG. 4 is a series of waveforms representing the operation of the circuit of FIG. 3.

An equivalent circuit representing the drive of a resistance welding system (L, R) under the control of a thyristor Q is shown in FIG. 3. Only the current which flows in one half-cycle is considered in the circuit of FIG. 3, which is permissible since the current flow in each half-cycle is independent of previous cycles. The waveforms associated with the circuit of FIG. 3 are shown in FIG. 4.

After each pulse of gate current $i_G$, while thyristor Q in FIG. 3 is conducting $$v_L + v_R = v_o = v \quad V \quad (1)$$

$$\text{OR} \quad L\frac{di}{dt} + Ri = \sqrt{2}\, V \sin wt \quad V \quad (2)$$

The solution to equation 1 is $$i = \frac{\sqrt{2}}{Z} V \sin(wt - \phi) + Ae^{-(R/L)t} \quad A \quad (3)$$

where $$Z = [R^2 + (wL)^2]^{\frac{1}{2}} \quad (4)$$

$$\phi = \tan^{-1}(wL/R) \; rad \quad (5)$$

substitution in equation 3 of the initial conditions i=0 at wt=α yields $$i = \frac{\sqrt{2}}{Z} V [\sin(wt - \phi) - \sin(\alpha - \phi)e^{(R/L)(\alpha/w - t)}] \quad A \quad (6)$$

from equation 5

$$R/L = w/\tan\phi \qquad (7)$$

substitution of equation 7 in equation 6 yields $$i = \frac{\sqrt{2}}{Z} V[\sin(wt - \phi) - \sin(\alpha - \phi)e^{(\alpha - wt)/\tan\phi}] \quad A \qquad (8)$$

from equation 8 the normalized value of the average rectified current is $$I_N = \frac{1}{2\pi} \int_{\alpha}^{\alpha+\gamma} [\sin(wt-\phi) - \sin(\alpha-\phi)e^{(\alpha-wt)/\tan\phi}] d(wt) \qquad (9)$$

also from equation 8 the normalized value of the RMS current is $$I_{RN} = \left[ (\tfrac{1}{2}\pi) \int_{\alpha}^{\alpha+\gamma} [\sin(wt-\phi) - \sin(\alpha-\phi)e^{(\alpha-wt)/\tan\phi}]^2 d(wt) \right]^{\frac{1}{2}} \qquad (10)$$

at $wt = \alpha + \gamma$, i is again zero, so that from equation 8

$$\sin(\alpha+\gamma-\phi) = \sin(\alpha-\phi)e^{-\gamma/\tan\phi} \qquad (11)$$

and $\phi$ may be determined by the solution of this transcendental equation.

The last three equations are important since they are used to construct the look-up table 21 in FIG. 2.

In the following discussion it is assumed the firing angle ($\alpha$) is known. For each pair of values ($\alpha, \gamma$) Equation 11 is solved for $\phi$ using methods common to the solution of transcendental equations. Next, this value of $\phi$ along with $\alpha$ and $\gamma$ are used to solve Equations 9 and 10 for $I_N$ and $I_{RN}$ using numerical integration methods. Finally, the ratio $I_{RN}/I_N$ is calculated.

Figure 5:
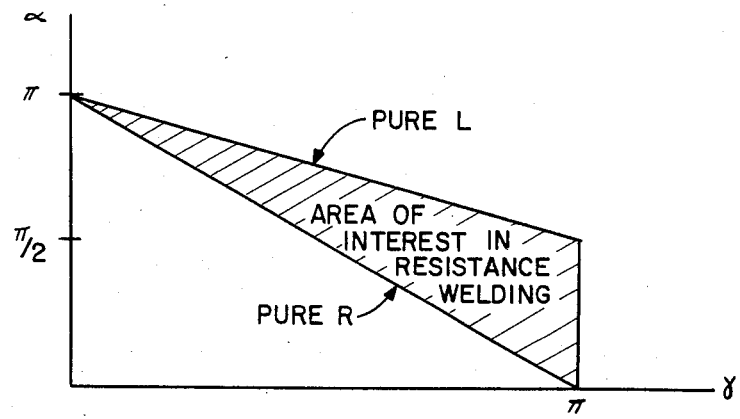
FIG. 5 is a graph useful in explaining the operation of the software portion of the system of the invention.

The $I_{RN}/I_N$ ratios are calculated for data points in the shaded portion of the plot shown in FIG. 5. This data is permanently stored in the look-up table 21 in FIG. 2.

The following is a listing of the basic program to calculate the ratios ($I_N/I_{RN}$). This program equates percent heat to firing angle $\alpha$, and it equates conduction count to conduction angle $\gamma$ using the following relationships: 132 conduction counts equal $\pi$ radians:

$$\%\text{heat}/100 = (\pi-\alpha)/\pi + \sin(2\alpha)/2\pi$$

```
5    REM-RATIO6--PROGRAM TO CALCULATE IN/IRN RATIOS
10   INPUT "% HEAT RANGE";HSTART,HFINISH
20   PI=355/113
30   AGUESS=PI/2
40   FOR HEAT=HSTART TO HFINISH
50   REM *****CALC ALPHA FROM % HEAT*****
60   DEF FNF(XX)=HEAT/100-(PI-XX)/(PI-SIN(2*XX)/2*PI)
70   DEF FNDF(XX)=1/PI-COS(2*XX)/PI
80   XX=AGUESS
90   GOSUB 780
100  IF ER=0 THEN A=XX*180/PI ELSE 120
110  AGUESS=XX:GOTO 130
120  A=0
130  LPRINT
140  LPRINT
150  LPRINT TAB(20) "*";HEAT;"% HEAT (FIRING ANGLE=";A;"DEGREES)*"
160  LPRINT
170  L=0
180  FOR I=0 TO 5
190  T(I)=0:R(I)=0:GC(I)=0:G(I)=0
200  NEXT I
210  B=360-(2*A)
220  IF B>180 THEN B=180
230  TGUESS=.01
240  FOR GC=INT((180-A)*132/180)+1 TO INT(B*132/180+1) STEP 1
250  C=GC*180/132
260  REM *****CALC THETA*****
270  A1=A*PI/180:G1=G*PI/180
280  DEF FNF(XX)=SIN(A1+G1-XX)-SIN(A1-XX)*EXP(-G1/TAN(XX))
290  DEF FNDF(XX)=-COS(A1+G1-XX)-(SIN(A1-XX)*EXP(-G1/TAN(XX))*G1/SIN(XX) 2+EXP(-G1/TAN(XX))*(-COS(A1-XX)))
300  XX=TGUESS
310  GOSUB 780
320  IF ER=0 THEN T=XX*180/PI ELSE 340
330  TGUESS=XX:GOTO 350
340  T=0
350  REM *****CALC RATIO*****
360  DEF FNF(XX)=SIN(XX-T1)-SIN(A1-T1)*EXP(A1-XX)/TAN(T1))
370  DEF FNDF(XX)=COS(XX-T1)-SIN(A1-T1)*EXP((A1-XX)/(-TAN(T1))/(-TAN(T1))
380  T1-T*PI/180
390  LOWER=A1
400  UPPER=A1+G1
410  GOSUB 890
420  RATIO1=SUM/(2*PI)
430  DEF FNF(XX)=(SIN(XX-T1)-SIN(A1-T1)*EXP((A1-XX)/TAN(T1)))  2
440  DEF FNDF(XX)=2*(SIN(XX-T1)-SIN(A1-T1)*EXP((A1-XX)/TAN(T1)))*(COS(XX-T1)-SIN
     A1-T1)*EXP((A1-XX)/TAN(T1))/(-TAN(T1)))
450  GOSUB 890
460  RATIO2=SQR(SUM/(2*PI))
470  R=RATIO1/RATIO2
```

-continued

```
480   G(L)=G
490   GC(L)=GC
500   T(L)=T
510   R(L)=R
520   IF R(L)>=1 THEN R(L)=999999!
530   IF R(L)>-9.999999E-06 AND R(L)<9.999999E-06 THEN R(L)=0
540   IF R(L)<=-1 THEN R(L)=-99999!
550   L=L+1
560   IF L<6 THEN 620
570   GOSUB 670
580   L=0
590   FOR I=0 TO 5
600   T(I)=0:R(I)=0:GC(I)=0:G(I)=0
610   NEXT I
620   NEXT GC
630   IF L=0 THEN 650
640   GOSUB 670
650   NEXT HEAT
660   END
670   REM *****PRINT ONE BATCH OF DATA SUBROUTINE*****
680   LPRINT "CONDUCTION COUNT" TAB(20);
690   LPRINT USING " +### ";GC(0),GC(1),GC(2),GC(3),GC(4),GC(5)
700   LPRINT "CONDUCTION ANGLE" TAB(20);
710   LPRINT USING " +###, # ";G(0),G(1),G(2),G(3),G(4),G(5)
720   LPRINT "POWER FACTOR" TAB(20);
730   LPRINT USING "+##, ### ";T(0),T(1),T(2),T(3),T(4),T(5)
740   LPRINT "RATIO (IN/IRN)" TAB(20);
750   LPRINT USING "+, ##### ";R(0),R(1),R(2),R(3),R(4),R(5)
760   LPRINT
770   RETURN
780   REM *****SOLUTION TO F(XX)=0 SUBROUTINE*****
790   ER=0
800   FOR II=1 TO 25
810   XX1=FNF(XX)
820   XX2=FNDF(XX)
830   DIFF=XX1/XX2
840   XX=XX-DIFF
850   IF ABS(DIFF)<=ABS(.001*XX) THEN RETURN
860   NEXT II
870   ER=1
880   RETURN
890   REM *****F(XX) INTEGRATION SUBROUTINE*****
900   PIECES=2
910   DELTA=(UPPER-LOWER)/PIECES
920   ODDSUM=FNF(LOWER+DELTA)
930   EVENSUM=0
940   ENDSUM=FNF(LOWER)+FNF(UPPER)
950   ENDCOR=FNDF(LOWER)-FNDF(UPPER)
960   SUM=(ENDSUM+4*ODDSUM)*DELTA/3
970   PIECES=PIECES*2
980   SUM1=SUM
990   DELTA=(UPPER-LOWER)/PIECES
1000  EVENSUM=EVENSUM+ODDSUM
1010  ODDSUM=0
1020  FOR II=1 TO PIECES/2
1030  ODDSUM=ODDSUM+FNF(LOWER+DELTA*(2*II-1))
1040  NEXT II
1050  SUM=7*ENDSUM+14*EVENSUM+16*ODDSUM+ENDCOR*DELTA
1060  SUM=(SUM*DELTA)/15
1070  IF (ABS(SUM-SUM1)>ABS(.001*SUM)) THEN 970
1080  RETURN
```

A portion of the print-out created by the basic program listed above is as follows:

|  | *** 9 % HEAT (FIRING ANGLE= 135.1524 DEGREES)*** | | | | | |
|---|---|---|---|---|---|---|
| CONDUCTION COUNT | +33 | +34 | +35 | +36 | +37 | +38 |
| CONDUCTION ANGLE | +45.0 | +46.4 | +47.7 | +49.1 | +50.5 | +51.8 |
| POWER FACTOR | +0.152 | +1.516 | +2.880 | +4.244 | +5.613 | +6.999 |
| RATIO (IN/IRN) | +.30950 | +.31594 | +.32229 | +.32847 | +.33442 | +.34012 |
| CONDUCTION COUNT | +39 | +40 | +41 | +42 | +43 | +44 |
| CONDUCTION ANGLE | +53.2 | +54.5 | +55.9 | +57.3 | +58.6 | +60.0 |
| POWER FACTOR | +8.421 | +9.898 | +11.446 | +13.083 | +14.824 | +16.682 |
| RATIO (IN/IRN) | +.34556 | +.35078 | +.35582 | +.36069 | +.36543 | +.37005 |
| CONDUCTION COUNT | +45 | +46 | +47 | +48 | +49 | +50 |
| CONDUCTION ANGLE | +61.4 | +62.7 | +64.1 | +65.5 | +66.8 | +68.2 |
| POWER FACTOR | +18.673 | +20.809 | +23.106 | +25.574 | +28.225 | +31.067 |
| RATIO (IN/IRN) | +.37456 | +.37898 | +.38331 | +38756 | +39174 | +39585 |
| CONDUCTION COUNT | +51 | +52 | +53 | +54 | +55 | +56 |

-continued

| *** 9 % HEAT (FIRING ANGLE= 135.1524 DEGREES)*** | | | | | | |
|---|---|---|---|---|---|---|
| CONDUCTION ANGLE | +69.5 | +70.9 | +72.3 | +73.6 | +75.0 | +76.4 |
| POWER FACTOR | +34.109 | +37.349 | +40.786 | +44.410 | +48.201 | +52.135 |
| RATIO (IN/IRN) | +.39990 | +.40389 | +.40782 | +.41171 | +.41554 | +.41933 |
| CONDUCTION COUNT | +57 | +58 | +59 | +60 | +61 | +62 |
| CONDUCTION ANGLE | +77.7 | +79.1 | +80.5 | +81.8 | +83.2 | +84.5 |
| POWER FACTOR | +56.179 | +60.293 | +64.432 | +68.551 | +72.605 | +76.553 |
| RATIO (IN/IRN) | +.42307 | +.42677 | +.43043 | +.43405 | +.43763 | +.44118 |
| CONDUCTION COUNT | +63 | +64 | +65 | +66 | +0 | +0 |
| CONDUCTION ANGLE | +85.9 | +87.3 | +88.6 | +90.0 | +0.0 | +0.0 |
| POWER FACTOR | +80.361 | +84.001 | +87.455 | +90.710 | +0.000 | +0.000 |
| RATIO (IN/IRN) | +.44470 | +.44818 | +.45163 | +.45504 | +.00000 | +.00000 |

Figure 6A:
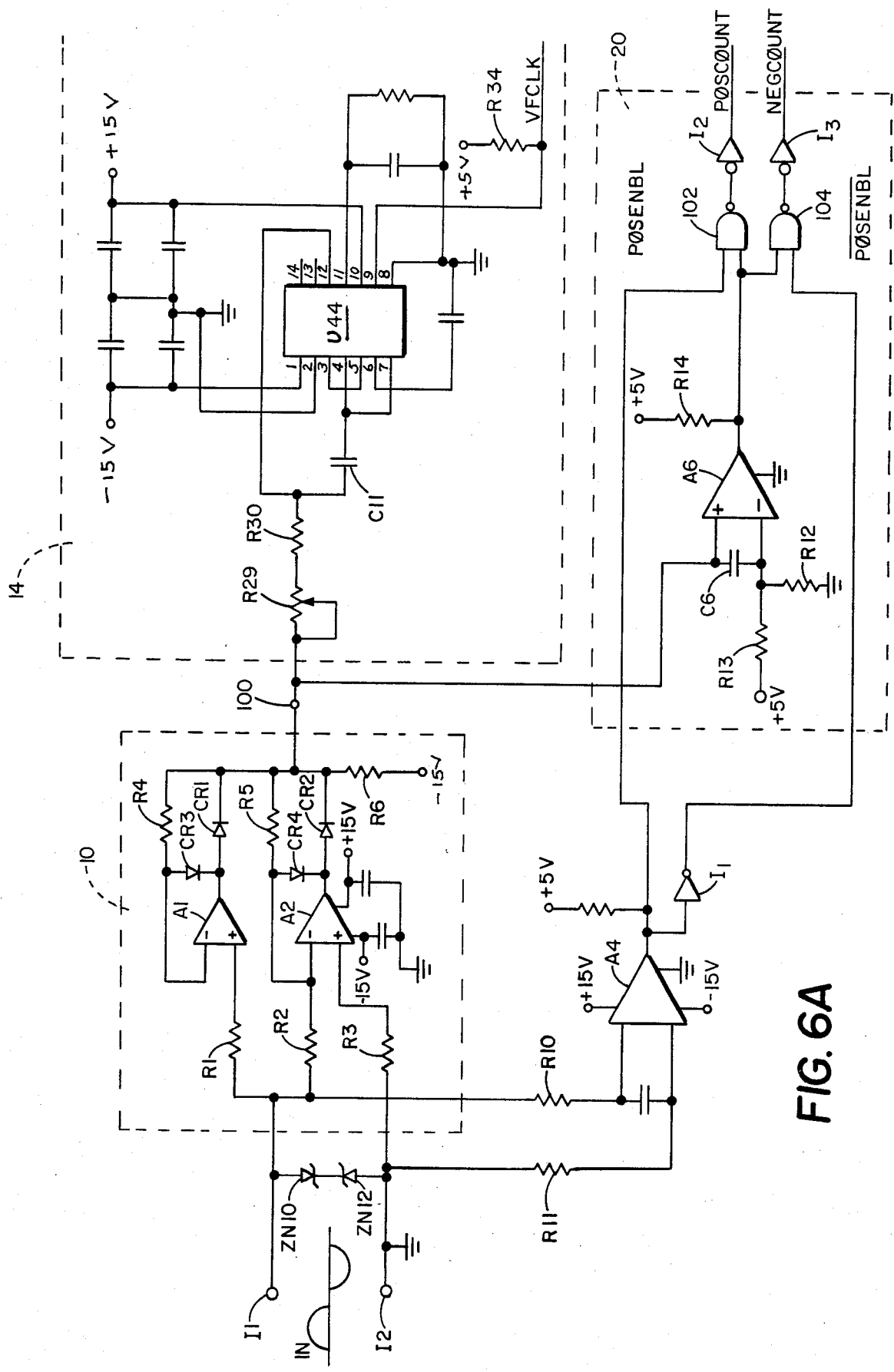
FIGS. 6A, 6B are circuit diagrams of one embodiment of a system implementing the hardware portion of the system of FIG. 2.
Figure 6B:
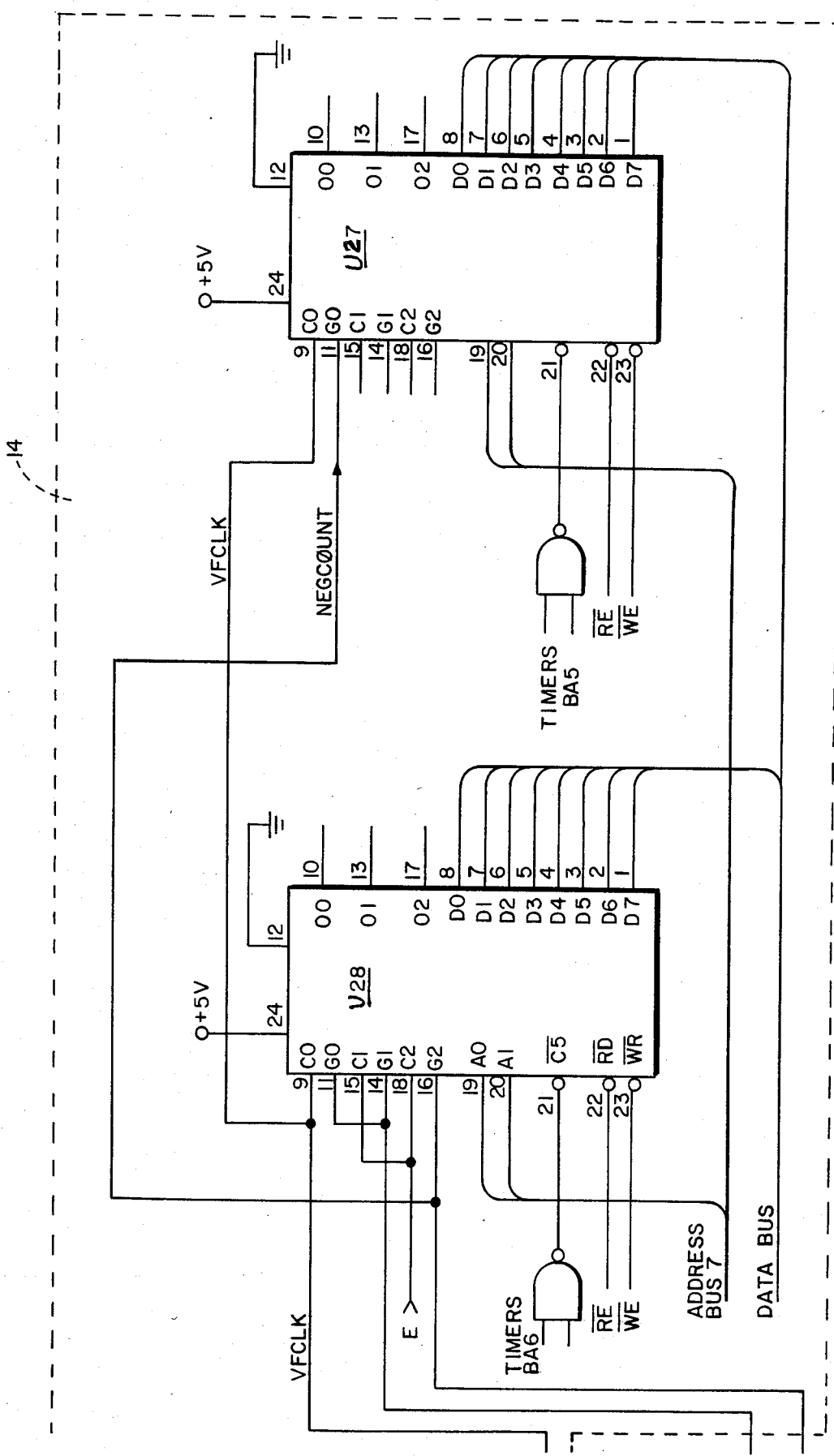

A circuit for implementing the hardware portion of the system of the invention is shown in FIGS. 6A, 6B.

In the circuit of FIGS. 6A, 6B the block 10 of FIG. 2 is formed by a pair of operational amplifiers A1 and A2 each of which may be of the type designated 324. The input current is applied to a pair of input terminals $I_1$ and $I_2$, one of which is grounded. The input current is supplied by, for example, a thyristor controlled circuit, and it has the waveform shown to the left in FIG. 6A. A pair of Zener diodes ZN10 and ZN12 are connected across the input terminals, and these may be of the type designated IN759.

Input terminal $I_1$ is connected through a pair of 10 kilo-ohm resistors R1 and R2 respectively to the positive input of amplifier A1 and to the negative input of amplifier A2. The positive input of amplifier A2 is connected to a grounded 10 kilo-ohm resistor R3. The output of amplifier A1 is connected through a diode CR1 to output terminal 100, and the output of amplifier A2 is connected through diode CR2 to the output terminal.

Diode CR1 is shunted by a 10 kilo-ohm resistor R4 and a diode CR3, the common junction of which is connected to the negative input of amplifier A1. Diode CR2 is shunted by a 10 kilo-ohm resistor R5 and diode CR4, the common junction of which is connected to the negative input of amplifier A2. Output terminal 100 is connected through a 10 kilo-ohm resistor R6 to the negative input of a 15-volt direct voltage source.

The circuitry described above functions as a full-wave rectifier for the input current, and the full-wave rectified current appears at output terminal 100.

The block 14 in FIG. 2 is implemented by the circuitry contained within the broken lines 14 in FIGS. 6A and 6B, and is similar to the circuitry used in the systems described in the copending application and issued patent referred to above. The circuitry includes two integrated circuit counter/timers U27, U28, each of which is an Intel type 8253 programmable integrated circuit. These integrated circuits each contain a set of three independent counters which are used as timers. All operations of each of the integrated circuits U27 and U28 are programmable. The microprocessor of the controller pre-loads the counters in each integrated circuit U27 and U28 by way of the data bus.

The full-wave recitifer circuit 10 produces a full-wave rectified, unfiltered output to a voltage-to-frequency converter chip U44 which may be of the type designated RC4158. The chip U44 produces a series of clock pulses (VFCLK) which are frequency modulated by the current from the rectifier 10. The output appearing at terminal 100 of rectifier 10 is applied to pin 4 of chip U44 to a 10 kilo-ohm variable resistor R29, and through a 6.81 kilo-ohm precision resistor R30, and 9300 picofarad mylar capacitor C11. The frequency modulated clock signal VFCLK appears at pin 10 of chip U44 and is applied to pin CO of chip U28 and to pin CO of chip U27. Pin 9 of chip U44 is connected to the positive terminal of the 5-volt direct voltage source through a 3.3 kiloohm resistor R34.

The terminal $I_1$ is also connected through a 10 kilo-ohm resistor R10 to the positive input of an operational amplifier A4 of the type designated LM319. The negative input of the amplifier is connected to a grounded 10 kilo-ohm resistor R11. The output of amplifier A4 is connected to the positive terminal of the 5-volt source through a 3.3 kilo-ohm resistor R11. An output signal appears at the output of amplifier A4 only when the current input is in a positive half-cycle. The output of amplifier A4 is connected directly to a "nand" gate 102 which may be of the type designated 74LS00, and the output of the amplifier is coupled through an inverter I1 to a similar "nand" gate 104. Inverter L1 may be of the type designated 74LS04. Accordingly, the amplifier A4 applies a signal POSENBL to "nand" gate 102 during positive half-cycles, and applies a signal $\overline{\text{POSENBL}}$ to "nand" gate 104 during negative half-cycles. This means that "nand" gate 102 is enabled during positive half-cycles, and "nand" gate 104 is enabled during negative half-cycles.

The output terminal 100 of full-wave rectifier 10 is also connected to the positive input of an operational amplifier A6 which serves as the threshold detector 20 of FIG. 2. The negative input of the operational amplifier is connected to a 220 ohm grounded resistor R12 and through a 10 kilo-ohm resistor R13 to the positive terminal of the 5-volt source. A 0.1 microfarad capacitor C6 is connected between the positive and negative inputs of the amplifier A6. The output terminal of amplifier A6 is connected to the "nand" gates 102 and 104, and through a 3.3 kilo-ohm resistor R14 to the positive terminal of the 5-volt source.

The "nand" gate 102 is connected through inverter I2 to the pins G0 and G1 of chip U28, and "nand" gate 104 is connected to inverter I3 to pin G2 of chip U28, and to pin G0 of chip U27. Inverter I2 provides an output signal designated POSCOUNT, and inverter I3 produces an output signal designated NEGCOUNT. The chips U27 and U28 are addressed by address signals A0, A1 on the address bus of the system, from the microprocessor, and supply data signals D0–D7 to the microprocessor on the data bus. A clock signal E is supplied to pins C1 and C2 of chip U28.

The circuit of block 14 in FIGS. 6A, 6B, which includes the integrated circuits U44, U27 and U28, serves to integrate the absolute current from the full-wave rectifier to produce $I_N = \int I(t)dt$.

This is achieved by converting $|I(t)|$ into frequency modulated pulses VFCLK in integrated circuit U44 and counting the pulses in integrated circuits U27 and U28. The integrated circuit U28 is activated during the positive half-cycles by the signal POSCOUNT applied to pin G0 so that the frequency modulated pulses VFCLK are counted during the positive half-cycles; and the integrated circuit U27 is activated during the negative half-cycles by the signal NEGCOUNT applied to its pin G0 so that the frequency modulated pulses VVCLK are counted during the negative half-cycles. The resulting digital output signals D0–D7 from each of the integrated circuits U27 and U28 are transmitted to the microprocessor over the data bus and these signals are a measure of $I_N = \int I(t)dt$.

The NEGCOUNT signal is also applied to pin G2 of integrated circuit U28, and the POSCOUNT signal is also applied to pin G2 of integrated circuit U28. The clock signal E is applied to pins C1 and C2 of integrated circuit U28.

These latter signals cause the integrated circuit U28 to count the E pulses during intervals of current flows to determine how long the current flows during each voltage half-cycle to obtain the conduction angle α, and digital data signals D0–D7 representing the conduction angle are sent to the microprocessor from integrated circuit U28 over the data bus.

The microprocessor utilizes the digital data signals received over the data bus from the integrated circuits U27 and U28 to activate the look-up table 21 (FIG. 2) stored in its memory so that the appropriate $I_{RN}/I_N$ signal may be derived from the table. The microprocessor then performs a multiplication function, as discussed in conjunction with FIG. 2, to derive the RMS current $I_{RN}$.

As mentioned above, the resulting RMS current $I_{RN}$ can be used in any known type of control loop to maintain constant tip temperature in the controlled welding machine despite fluctuations in line voltage and/or load.

It will be appreciated that while a particular embodiment of the invention has been shown and described, modifications may be made. It is intended in the claims to cover all modifications which come within the true spirit and scope of the invention.

What is claimed is:

1. A system for caluculating the RMS value of a sinusoidal current flowing in an inductive/resistance welding system, or the like, comprising: an input circuit for receiving a sinusoidal current I(t); a full-wave rectifier circuit connected to said input circuit for providing a current representing the absolute value of the sinusoidal current $|I(t)|$; an integrating circuit connected to said full-wave rectifier circuit for deriving a signal $I_N$ representative of the integral $\int I(t)dt$ of the output of the full-wave rectifier circuit; circuitry including a threshold detector circuit connected to said full-wave rectifier circuit for producing a signal representing the conduction angle γ of the sinusoidal current; and a microprocessor means including a look-up table stored in its memory, said microprocessor means being connected to the integrating circuit and to said last-named circuitry and being responsive to the outputs $I_N$ and γ of the integrating circuit and last-named circuitry for producing a signal derived from said look-up table representing the ratio of two signals $I_{RN}/I_N$, and said microprocessor means including means for performing a multiplication function for multiplying the output $I_N$ of said integrating circuit and the output $I_{RN}/I_N$ of said look-up table to obtain a signal $I_{RN}$ representing the RMS value of the sinusoidal current.

2. The system defined in claim 1, in which said integrating circuit includes circuit means for converting the current from said full-wave rectifier circuit into frequency modulated pulses, and further circuit means for counting the frequency modulated pulses during each half-cycle of the current from said full-wave rectifier circuit.

3. The system defined in claim 1, in which said RMS value is calculated in the presence of a non-capacitive inductive/resistance load.

4. The system defined in claim 1, in which said full-wave rectifier is formed of a pair of operational amplifiers.

5. The system defined in claim 1, in which said threshold detector includes an operational amplifier.

* * * * *